(12) United States Patent
Buelow, II (10) Patent No.: US 8,847,061 B2
(45) Date of Patent: Sep. 30, 2014

(54) METHOD OF MAKING SOLAR COLLECTOR ASSEMBLIES WITH OPTICAL CONCENTRATOR ENCAPSULANT

(75) Inventor: Roger F. Buelow, II, Gate Mills, OH (US)

(73) Assignee: Energy Focus, Inc., Solon, OH (US)

( * ) Notice: Subject to any disclaimer, the term of this patent is extended or adjusted under 35 U.S.C. 154(b) by 918 days.

(21) Appl. No.: 12/814,361

(22) Filed: Jun. 11, 2010

(65) Prior Publication Data
US 2010/0313955 A1 Dec. 16, 2010

Related U.S. Application Data

(60) Provisional application No. 61/186,309, filed on Jun. 11, 2009.

(51) Int. Cl.
| | |
|---|---|
| *H01L 31/042* | (2014.01) |
| *H01L 31/0232* | (2014.01) |
| *H01L 31/048* | (2014.01) |
| *H01L 31/052* | (2014.01) |
| *F24J 2/06* | (2006.01) |
| *B29C 45/14* | (2006.01) |
| *G02B 5/10* | (2006.01) |

(52) U.S. Cl.
CPC .......... *H01L 31/0522* (2013.01); *H01L 31/048* (2013.01); *Y02E 10/52* (2013.01)
USPC ........... 136/246; 136/251; 136/252; 136/259; 126/600; 126/684; 264/272.14; 359/894

(58) Field of Classification Search
CPC .... H01L 31/048; H01L 31/0522; Y02E 10/52
USPC .......... 136/244, 246, 251, 259; 126/600, 684; 264/272.14; 359/894
See application file for complete search history.

(56) References Cited

U.S. PATENT DOCUMENTS

| | | | |
|---|---|---|---|
| 5,406,641 | A | 4/1995 | Bigley, Jr. et al. |
| 6,093,757 | A | 7/2000 | Pern |
| 6,440,769 | B2 * | 8/2002 | Peumans et al. ............... 438/65 |
| 7,569,764 | B2 * | 8/2009 | Shan et al. .................... 136/246 |
| 7,906,722 | B2 * | 3/2011 | Fork et al. .................... 136/246 |
| 2006/0272698 | A1 | 12/2006 | Durvasula |
| 2008/0093764 | A1 | 4/2008 | Ito et al. |
| 2008/0245784 | A1 * | 10/2008 | Lawrence et al. .......... 219/458.1 |
| 2009/0014055 | A1 | 1/2009 | Beck et al. |
| 2009/0032087 | A1 * | 2/2009 | Kalejs .......................... 136/246 |
| 2009/0056806 | A1 | 3/2009 | Gibson et al. |

(Continued)

*Primary Examiner* — Jayne Mershon
*Assistant Examiner* — Mayla Gonzalez Ramos
(74) *Attorney, Agent, or Firm* — Bruzga & Associates; Charles E. Bruzga; Jay S. Pattumudi (57) ABSTRACT

Disclosed is a method of making solar collector assemblies for photovoltaic conversion. The method comprises providing a mold for receiving encapsulant, the mold having serially arranged, alternating peaks and valleys. A respective PV solar cell is placed into each of a series of the valleys such that the light-receiving surfaces of the PV solar cells face upwards. Uncured encapsulant is delivered into the mold and onto the light-receiving surfaces, and from the light-receiving surfaces to a level at least as high as the peaks so as to form, above the light-receiving surfaces, optical concentrators for concentrating light received by the optical concentrators and directing the light to the light-receiving surfaces. The encapsulant is then cured.

15 Claims, 6 Drawing Sheets

(56) References Cited

U.S. PATENT DOCUMENTS

2009/0152745 A1 6/2009 Gibson et al.
2009/0159128 A1 6/2009 Shook et al.
2010/0258170 A1* 10/2010 Kornfield et al. ............. 136/255

* cited by examiner

METHOD OF MAKING SOLAR COLLECTOR ASSEMBLIES WITH OPTICAL CONCENTRATOR ENCAPSULANT

FIELD OF THE INVENTION

The present invention relates to a method of making solar collector assemblies with optical concentrator encapsulant on photovoltaic cells, and also relates to the resulting solar collector assemblies.

BACKGROUND OF THE INVENTION

The use of photovoltaic solar cells (PV solar cells) to collect solar energy and convert that energy to electricity is widely recognized. The PV solar cells are typically manufactured with impervious encapsulating layers to provide protection from environmental factors that may reduce the effectiveness of the solar cell in converting light to electricity. Such encapsulating layers may be formed from one or more of a polymer such as an acrylate-based polymer, ethylene vinyl acetate and TEDLAR-brand polyvinyl fluoride. Such encapsulating layers are used to limit the ingress of water, oxygen and other materials that may react with the cell material and cause degradation. The encapsulating layers are typically thin and provide protection only to the active PV solar cell.

It is also recognized that PV solar cells can operate more efficiently if there is a degree of concentration of sunlight on the PV solar cell. Concentration is typically achieved with a lens or other collection device that collects light over a wider area than is occupied by the active area of the PV solar cell. The collection devices are typically manufactured from glass or from a durable plastic and are placed over the encapsulated solar cell. The provision of the collection-and-concentration optics typically occurs as a separate step from the step of encapsulating PV solar cells, and therefore adds additional significant component of cost to solar collector assemblies.

Accordingly, it would be desirable to provide a streamlined, and hence more economical, method of making solar collector assemblies with encapsulated PV solar cells and an optical concentrator.

BRIEF SUMMARY OF THE INVENTION

A preferred form of the invention provides a method of making solar collector assemblies for photovoltaic conversion. The method comprises providing a mold for receiving encapsulant, the mold having serially arranged, alternating peaks and valleys. A respective PV solar cell is placed into each of a series of the valleys such that the light-receiving surfaces of the PV solar cells face upwards. Uncured encapsulant is delivered into the mold and onto the light-receiving surfaces, and from the light-receiving surfaces to a level at least as high as the peaks so as to form, above the light-receiving surfaces, optical concentrators for concentrating light received by the optical concentrators and directing the light to the light-receiving surfaces. The encapsulant is then cured.

Beneficially, the foregoing method provides a streamlined, and in comparison with the above-cited prior art, a more economical, method of making solar collector assemblies with encapsulated PV solar cells and an optical concentrator.

BRIEF DESCRIPTION OF THE DRAWINGS

In the following drawings, like reference numbers refer to like parts.

DETAILED DESCRIPTION OF THE PREFERRED EMBODIMENT

Figure 1A:
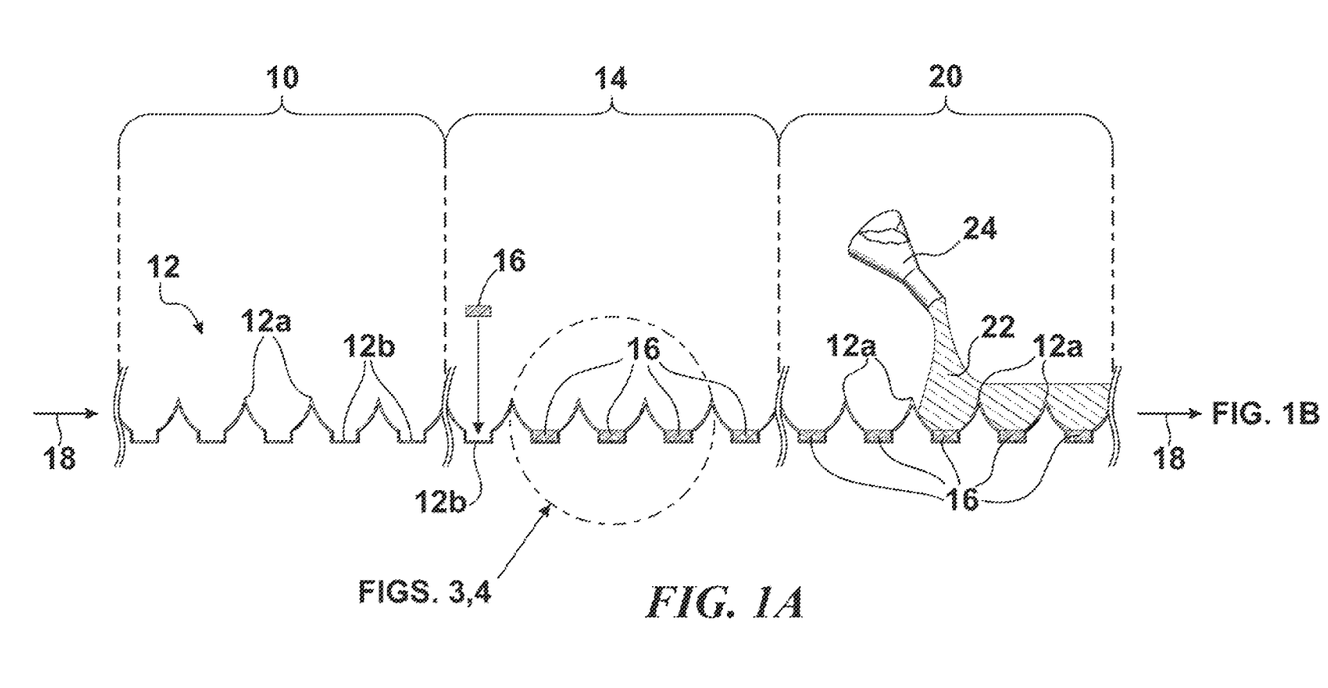
FIGS. 1A and 1B are schematic diagrams, intended to be viewed together, of sequential method steps for encapsulating light-receiving surfaces of PV solar cells in accordance with a preferred embodiment of the invention.
Figure 1B:
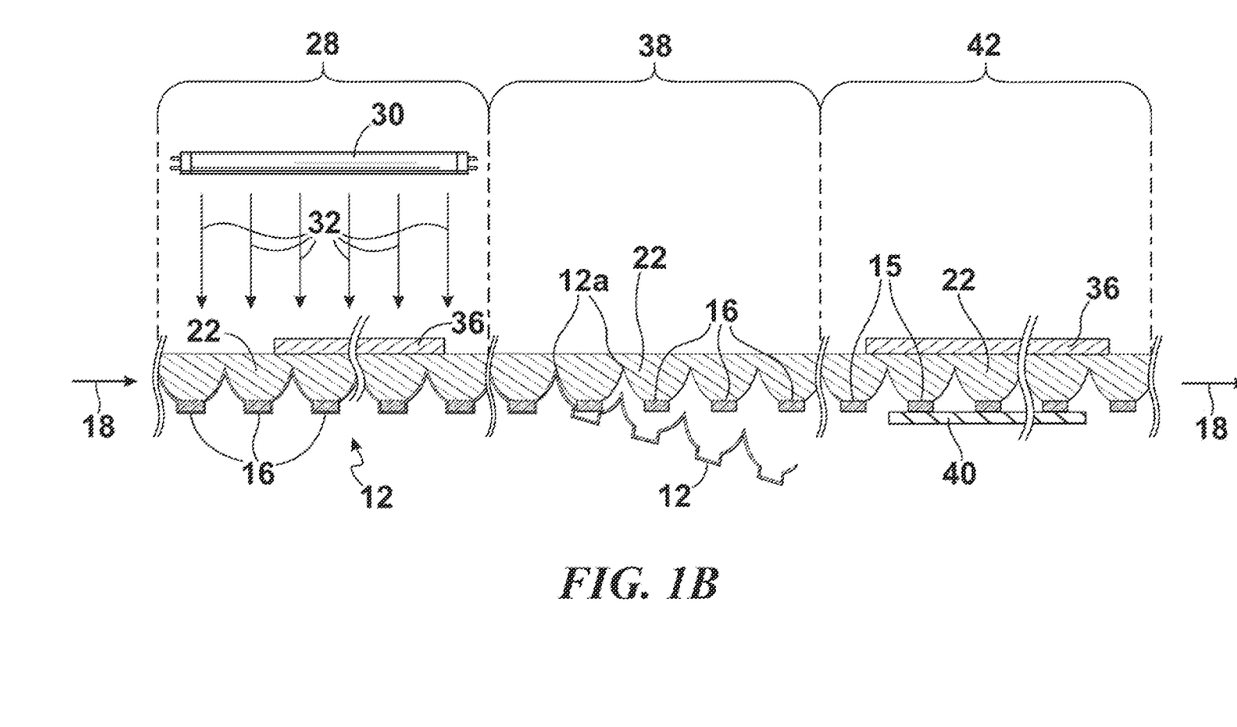

FIGS. 1A and 1B show various steps of a preferred method of making solar collector assemblies for photovoltaic conversion, with a PV encapsulant forming an optical concentrator. By "light-receiving surface" of a PV solar cell is meant the surface of a PV solar cell that receives light for the purposes of conversion into electricity.

Figure 1C:
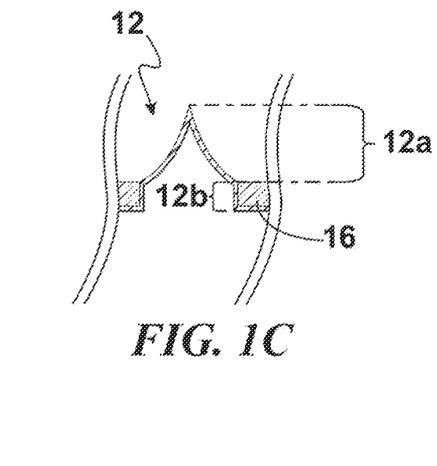
FIG. 1C is a schematic diagram of part of a mold and associated PV solar cell used in the method of FIGS. 1A and 1B.

In FIG. 1A, step 10 shows providing a mold 12 having peaks 12a and valleys 12b. FIG. 1C shows that a "peak" 12a is meant to include the vertical section of the mold shown within a bracket, which starts from the top of a PV solar cell 16 when inserted into the mold. On the other hand, as best shown in FIG. 1C, the valleys 12b are for receiving PV solar cells 16. This is shown in step 14, wherein a PV solar cell 16 is placed in a valley 12b in the mold 12. Mold 12 may be composed of a silicone-type material or another material such as polyethylene or polyethylene terephthalate with flexibility and adequate rigidity for the purposes set forth herein.

In FIGS. 1A and 1B, arrows 18 show movement of the mold 12 or other structures to the right, as may occur in an assembly line process.

Step 14 shows other PV solar cells 16 that have previously been placed into respective valleys in the mold 12. Following step 14, step 20 shows the delivery of uncured encapsulant from a source 24, shown in simplified schematic form. An actual source 24 for encapsulant 22 in an uncured state would typically employ a storage tank, a delivery pipe and a controlled valve (not shown).

Uncured encapsulant is delivered to the upwardly facing light-receiving surfaces of PV solar cells 16, and extends from the light-receiving surfaces to a level at least as high as the tops of peaks 12a of the mold 12, and preferably above the level of the tops of peaks 12a.

Following step 20, the uncured encapsulant in the mold 12 is cured as shown in curing step 28. In this step, an ultraviolet (UV) source 30 subjects to UV radiation encapsulant 22, which reaches the location for curing step 28 in an uncured state.

Alternatively, other techniques for curing the encapsulant can be used, such as using two-part epoxy materials that react after being mixed together and cause cross-linking. Other curing techniques employ heat to cause cross-linking, and some polymer systems require the addition of water to cause cross-linking. These other techniques will be obvious and routine to those of ordinary skill in the art.

Preferred Uncured Encapsulant Composition

The encapsulant 22, when cured, should have the properties of being highly transparent and durable. It is preferred that uncured encapsulant 22 comprise a crosslinkable polymer that has not yet been fully crosslinked, but which is still has sufficient fluidity that it can be molded as described herein. It is further preferred that the uncured encapsulant 22 contain at least one cross linking agent that becomes activated by UV radiation. The encapsulant is preferably at least 90 percent by weight polymeric material.

Examples of preferred compositions for the uncured encapsulant are described in U.S. Pat. Nos. 5,406,641 and 5,485,541, which are assigned to the present assignee.

Further, the following composition(s) are currently preferred for use as the uncured encapsulant:
- 0.2% based on monomer weight of IRGACURE-brand 184 and a monomer mixture of 99.9% butyl methacrylate and 0.1% diethyleneglycol dimethacrylate.
- 0.2% based on monomer weight of IRGACURE-brand 184 and a monomer mixture of 49.95% butylmethacrylate and 49.95% 2-ethylhexyl methacrylate with 0.1% diethyleneglycol dimethacrylate.

The composition of IRGACURE-brand 184 is 1-Hydroxycyclohexyl-phenyl-ketone. IRGACURE-brand 184 is manufactured by Ciba Specialty Chemicals, which is now part of BASF headquartered in Ludwigshafen am Rhein, Germany.

Applying Coverglass and Removing Mold

Preferably, during encapsulant curing step 28, a cover-plate 36 is applied to the top of encapsulant 22, so that the cover-plate seals the encapsulant from rain or other aspects of the environment that could damage the encapsulant. Cover-plate 36 may be a glass such as borosilicate or soda lime, or other material such as plastic having the ability to seal the encapsulant from rain or other aspects of the environment that could damage the encapsulant. Cover-plate 26 and any optional coating on cover-plate 36 may be impervious to UV radiation. If cover-plate 36 is impervious to UV radiation, it should be applied to the encapsulant as illustrated in step 28 [FIG. 1B) late in the curing step 28, or used with a UV-activated cross-linking agent in the encapsulant tuned to a different wavelength than the wavelengths blocked by the cover-plate 36. For instance, if the UV-activated cross-linking agents are tuned to 380 nm and the cover-plate 36 blocks UV below 350 nm, then the cover-plate will not stop the curing of encapsulant underneath the cover-plate.

After applying coverglass 36 to encapsulant 22 and at a time when the encapsulant is sufficiently cured (e.g., cross-linked) so that that the encapsulant does not lose its molded shape, a mold-removal step 38 may follow. In the mold-removal step, the mold 12 is removed from the underneath of the integrated structure formed by coverglass 36, encapsulant 12 and PV solar cells 16. This would expose an electrode on the bottom of each PV solar cell 16, which can be best seen in FIG. 2 as a planar electrode 16a of a PV solar cell 16.

Figure 2:
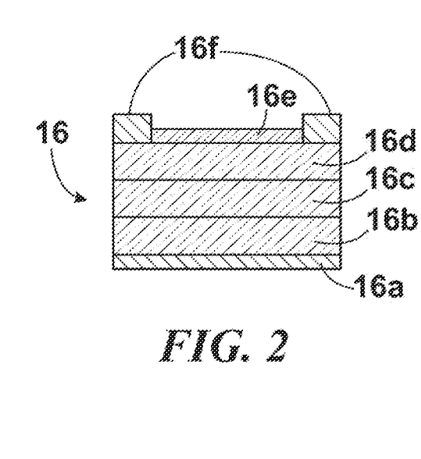
FIG. 2 is a side view of photovoltaic cell that may be used in the present invention.

The PV solar cell 16 of FIG. 2 has semiconductor layers 16b, 16c and 16d, an optional antireflective coating 16e, and upper electrode grid 16f. Layers 16b, 16c and 16d may comprise, for example, Silicon (Si), Gallium Arsenide Phosphide (GaAsP) and Gallium Indium Phosphide (GaInP), respectively, in a three-junction cell. PV solar cell 16 may have fewer semiconductor layers, such as Gallium Arsenide Phosphide (GaAsP) and Silicon (Si) in a two-junction cell, and other constructions of PV solar cells will be obvious and routine to those of ordinary skill in the art. Antireflective coating 16e preferably comprises rutile titania or other coatings made of nanostructured low-index materials or a one-sided low index fluoropolymer for durability and optical performance.

Mold-removal step 38 would be omitted if mold 12 is not intended to be removed from the PV solar cells 16 and encapsulant 22. However, the respective portions of a non-removable mold 12 that underlie PV solar cells 16 would typically need suitable openings (not shown) to allow access to the lower electrode 16a of the PV solar cell 16, shown in FIG. 2.

After the optional mold-removal step 38, the PV solar cells 16, encapsulant 22 and coverglass 36 may be mounted on a circuit board 40 to allow electrical connection from the lower electrode 16a of PV solar cell 16 (FIG. 2) to a printed circuit (not shown) on the board 40. Circuit board 40 also provides mechanical support to the PV solar cells 16, encapsulant 22 and coverglass 36.

One- and Two-Dimensional Arrays of PV solar cells

Figure 3:
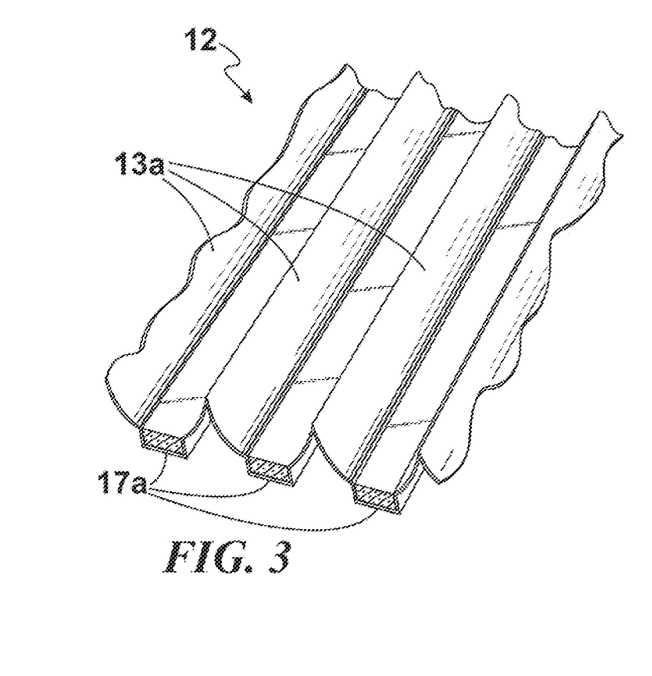
FIGS. 3 and 4 show upper perspective views of the mold and PV solar cell structure contained in the circle marked FIGS. 3, 4 in FIG. 1.
Figure 4:
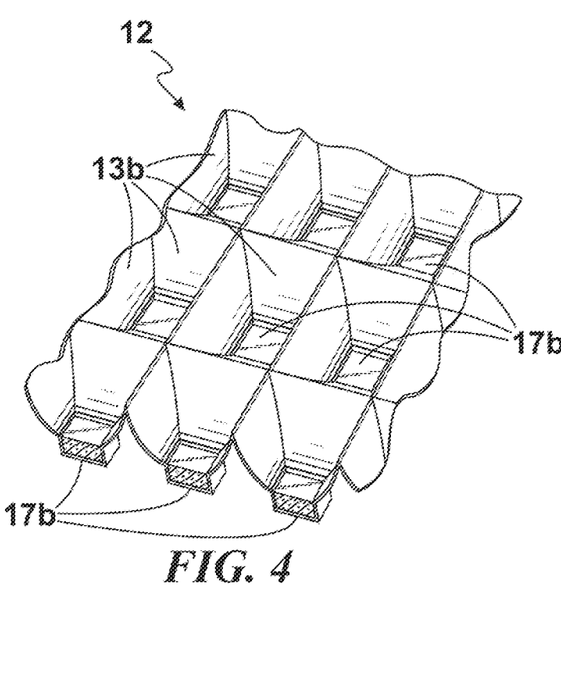

FIG. 3 shows a one-dimensional array of PV solar cells 17a in a mold 13a, whereas FIG. 4 shows a two-dimensional array of PV solar cells 17b in a mold 13b. Different reference numbers for PV solar cells and the molds are used compared with those used in the dashed-line circle in FIG. 1A marked FIGS. 3, 4, to emphasize the different possible geometries of the PV solar cells and molds in FIGS. 3 and 4. In particular, the PV solar cells 17a in FIG. 3 have elongated, rectangular shapes, whereas the PV solar cells 17b in FIG. 4 are preferably square.

Figure 1D:
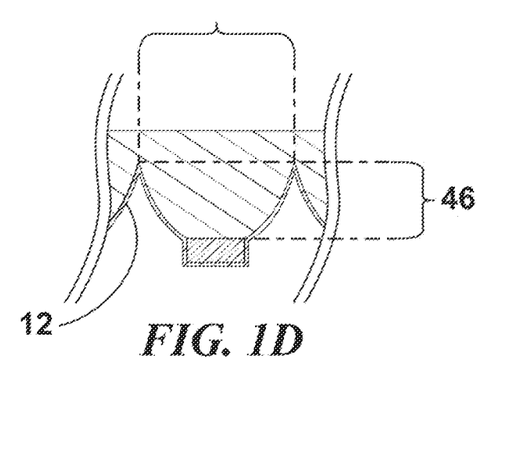
FIG. 1D is a schematic diagram of a part of a mold, associated PV solar cell and encapsulant, which may be used in the method FIGS. 1A and 1B.

FIGS. 3 and 4 also show curved shapes to peaks 13a and 13b, respectively, keeping in mind that "peaks" are defined with reference to FIG. 1C, described above. The curved shapes of peaks 13a and 13b are merely diagrammatic, and the actual shapes are preferably optimized so that the encapsulant placed in the mold will form non-imaging concentrators of light. With reference to FIG. 1D, one of the useful attributes of a non-imaging concentrator is a so-called angle-to-area conversion of light, whereby high angle light at the inlet areas of each light concentrator 46 is "converted" to smaller angle light at the smaller end-faces of each concentrator, which ends at the top of a PV solar cell 16. Smaller angle light at the tops of the PV solar cells 16 may more easily pass into the PV solar cells and be converted to electricity. Preferably, each light concentrator 46 is shaped so as to obtain at least about 80 percent of the photons that would be obtained from an ideally shaped non-imaging concentrator having the same input area (top of light concentrator 46 in FIG. 2) and the same output area (bottom of light concentrator in FIG. 2).

With reference to FIG. 1D, preferably each concentrator can concentrate light by a factor of between about 7 and 12. Concentration of at least about 2 to 3 is desired.

Figure 5A:
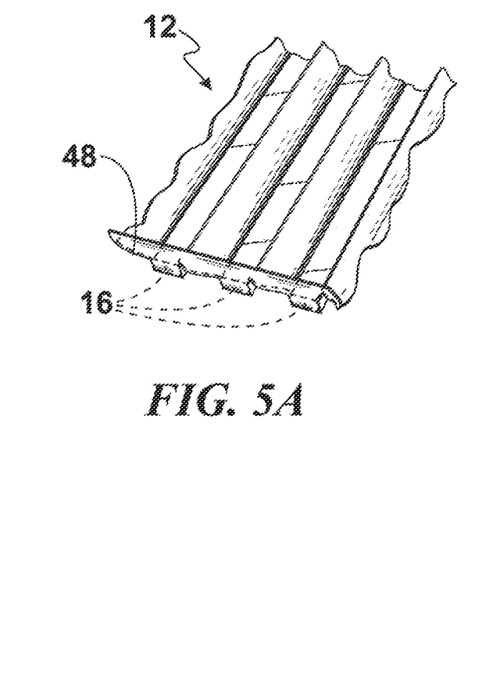
FIGS. 5A-5C are similar to FIGS. 2 and 3, but show in the foreground respective dams for containing uncured encapsulant during processing according to FIGS. 1A and 1B.

FIG. 5A shows an integrated dam 48 on the foreground side of mold 12, which prevents uncured encapsulant from leaking from the mold. Naturally, the background side of the mold (not shown) would have a similar dam.

Figure 5B:
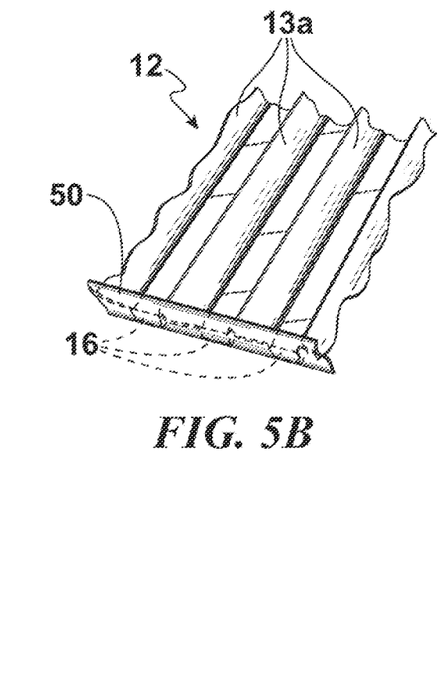

FIG. 5B shows a re-usuable dam 50, which can be mechanically pressed against the foreground side of mold 12. At some point during the curing process of encapsulant 22, the encapsulant will develop some adhesive properties so that it can then hold re-usable dam 50 by itself, or with a lesser amount of mechanical pressure than when the encapsulant is initially delivered into the mold. A similar re-usable dam (not shown) could be used for the background side of the mold (not shown).

Figure 5C:
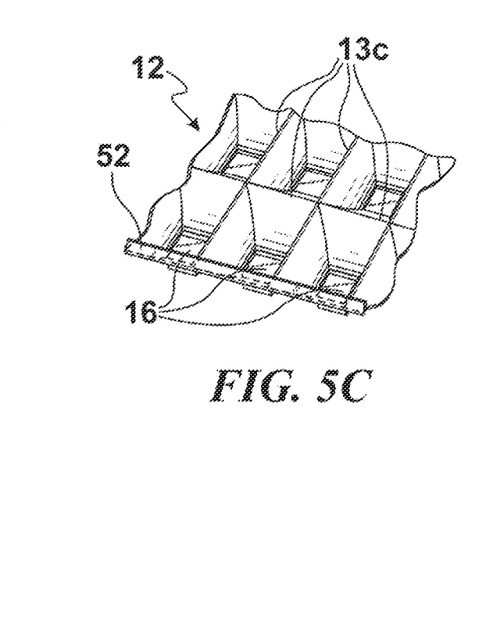

FIG. 5C shows a mold 12 with peaks 13c for a two-dimensional array of PV solar cells 16. For the mold shown, a short dam 52 could be used to make sure that the encapsulant (22, FIGS. 1A and 1B) can rise to above the level of peaks 13c, if desired.

Figure 6A:
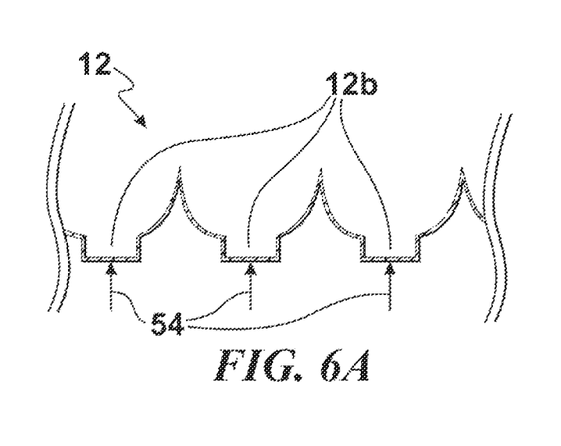
FIGS. 6A and 6B are side views of a mold for receiving PV solar Cells in different states of configuration, in accordance with an aspect of the invention.
Figure 6B:
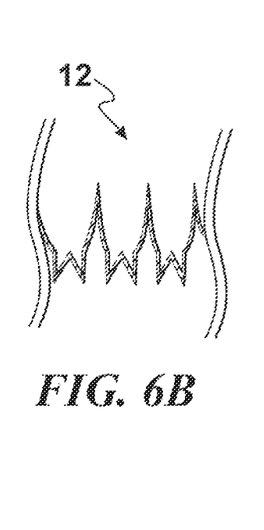

An optional aspect of the present method is illustrated in FIGS. 6A and 6B. Thus, a mold 12 of normal shape in FIG. 6A can be folded in accordion style, by pressing upwardly as indicated by arrows 54, along fold lines at the location of the arrows. The resulting, reduced-size mold 12 is shown in FIG. 6B. This allows for reduction in the volume necessary for storing mold to be used in step 14 of FIG. 1A, when PV solar cells 16 are inserted into the valleys 12b of the mold.

While the invention has been described with respect to specific embodiments by way of illustration, many modifications and changes will occur to those skilled in the art. It is, therefore, to be understood that the appended claims are intended to cover all such modifications and changes as fall within the true scope and spirit of the invention.

What is claimed is:

1. A method of making solar collector assemblies for photovoltaic conversion, comprising:
    a) providing a continuous, flexible mold for receiving encapsulant; the mold having serially arranged, alternating peaks and valleys;
    b) placing a respective PV solar cell into each of a series of the valleys such that light-receiving surfaces of the PV solar cells face upwards by passing the respective PV solar cell in a direction from a position between a pair of said adjacent peaks towards a valley between the peaks;
    c) delivering uncured encapsulant into the mold and—
        i) onto said light-receiving surfaces; and
        ii) from said light-receiving surfaces to a level at least as high as said peaks so as to form, above said light-receiving surfaces, respective optical concentrators for concentrating light received by the optical concentrators and directing said light to said light-receiving surfaces; and
    d) curing the uncured encapsulant.

2. The method of claim 1, wherein each optical concentrator is shaped so as to obtain at least about 80 percent of the photons that would be obtained from an ideally shaped non-imaging concentrator having the same input and output areas.

3. The method of claim 1, wherein the uncured encapsulant comprises greater than 90 percent by weight polymeric material.

4. The method of claim 1, wherein the uncured encapsulant comprises crosslinkable polymeric material.

5. The method of claim 4, further comprising applying a cover-plate to the top of the encapsulant while the encapsulant is in the process of curing;
    the cover-plate sealing the encapsulant from the environment.

6. The method of claim 5, wherein the step of curing the uncured encapsulant comprises directing UV radiation onto the uncured encapsulant to activate crosslinking agents in the uncured encapsulant.

7. The method of claim 1, wherein the mold is a releasable mold, and further comprising removing the mold from the PV solar cells and cured encapsulant.

8. The method of claim 7, further comprising the step of mounting the PV solar cells onto a circuit board.

9. The method of claim 1, wherein said optical concentrators concentrate light received by the optical concentrator by a factor greater than 2.

10. The method of claim 9, wherein said factor is about 7.

11. The method of claim 1, wherein providing a mold comprises providing a mold folded in accordion style and unfolding the mold so that it assumes a desired final shape.

12. A solar collector assembly made by the method of claim 1.

13. A solar collector assembly made by the method of claim 3.

14. A solar collector assembly made by the method of claim 5.

15. A solar collector assembly made by the method of claim 8.

* * * * *